(12) United States Patent
Suzuki

(10) Patent No.: US 9,772,976 B2
(45) Date of Patent: Sep. 26, 2017

(54) ELECTRON MICROSCOPE AND METHOD OF OPERATING THE SAME

(71) Applicant: JEOL Ltd., Tokyo (JP)

(72) Inventor: Takashi Suzuki, Tokyo (JP)

(73) Assignee: JEOL Ltd., Tokyo (JP)

( * ) Notice: Subject to any disclaimer, the term of this patent is extended or adjusted under 35 U.S.C. 154(b) by 1024 days.

(21) Appl. No.: 13/915,652

(22) Filed: Jun. 12, 2013

(65) Prior Publication Data

US 2013/0332116 A1   Dec. 12, 2013

(30) Foreign Application Priority Data

Jun. 12, 2012   (JP) ................................ 2012-132927

(51) Int. Cl.
| | |
|---|---|
| *H01J 37/28* | (2006.01) |
| *G06F 17/18* | (2006.01) |
| *H01J 37/285* | (2006.01) |

(52) U.S. Cl.
CPC .............. *G06F 17/18* (2013.01); *H01J 37/28* (2013.01); *H01J 37/285* (2013.01); *H01J 2237/06341* (2013.01); *H01J 2237/24495* (2013.01); *H01J 2237/24507* (2013.01)

(58) Field of Classification Search
USPC ..................... 702/191; 324/754.22; 250/306
See application file for complete search history.

(56) References Cited

U.S. PATENT DOCUMENTS 4,829,240 A * 5/1989 Kitaoka ............... G01R 31/305
                                                          324/754.22

FOREIGN PATENT DOCUMENTS

JP           5307942 A      11/1993

* cited by examiner

*Primary Examiner* — Lam Nguyen
(74) *Attorney, Agent, or Firm* — The Webb Law Firm

(57) ABSTRACT

An electron microscope and method of operating an electron microscope (1) has an electron beam source (11) for producing an electron beam, a noise canceling aperture (12) for detecting a part of the beam, an amplifier (42), an effective value calculating circuit (44) for extracting DC components of the output signal from the amplifier (42), a detector (15) for detecting a signal obtained in response to impingement of the beam on a sample (A), a preamplifier circuit (20), an amplifier circuit (30), a dividing circuit (54) for performing a division based on the output signal from the amplifier circuit (30) and on the output signal from the amplifier (42), and a multiplier circuit (58) for performing multiplication of the output signal from the dividing circuit (54) and the output from the effective value calculating circuit (44).

9 Claims, 15 Drawing Sheets

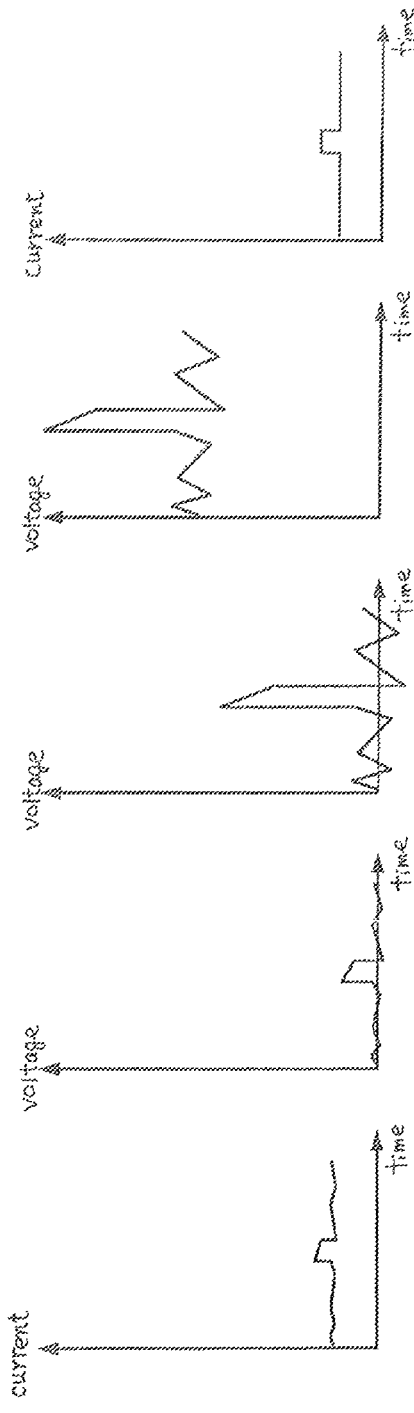

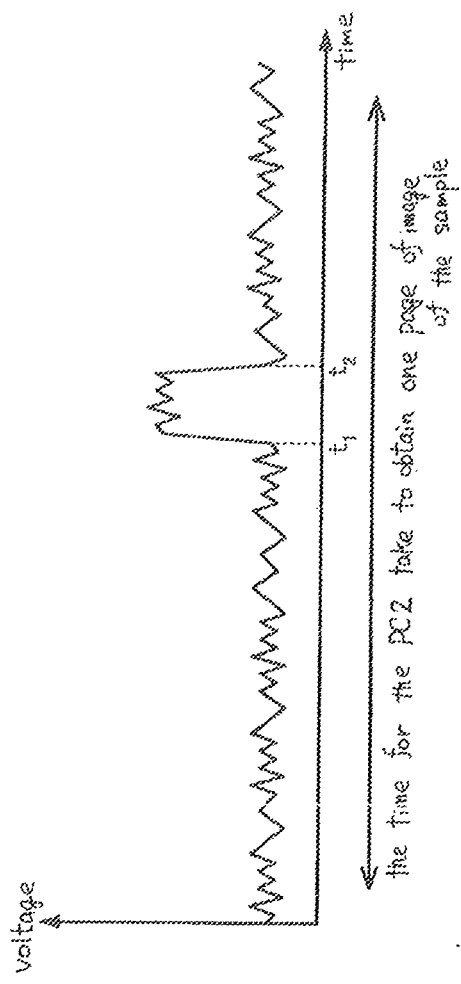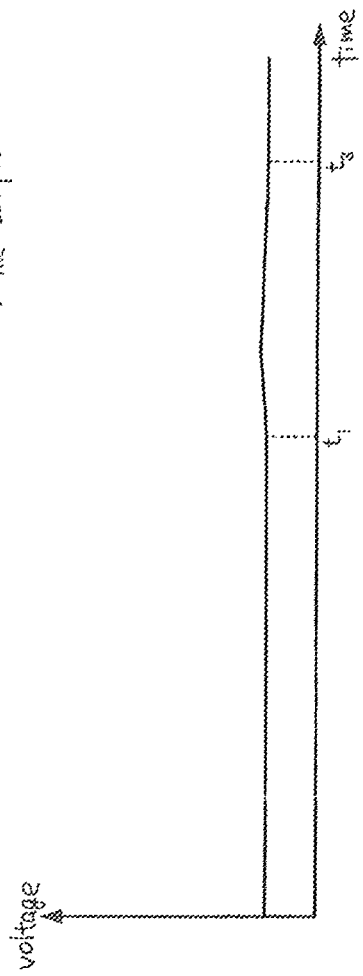
FIG. 4A
FIG. 4B

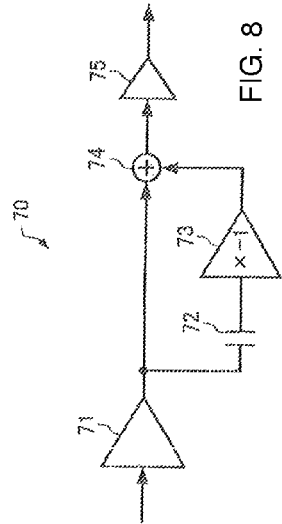
FIG. 8
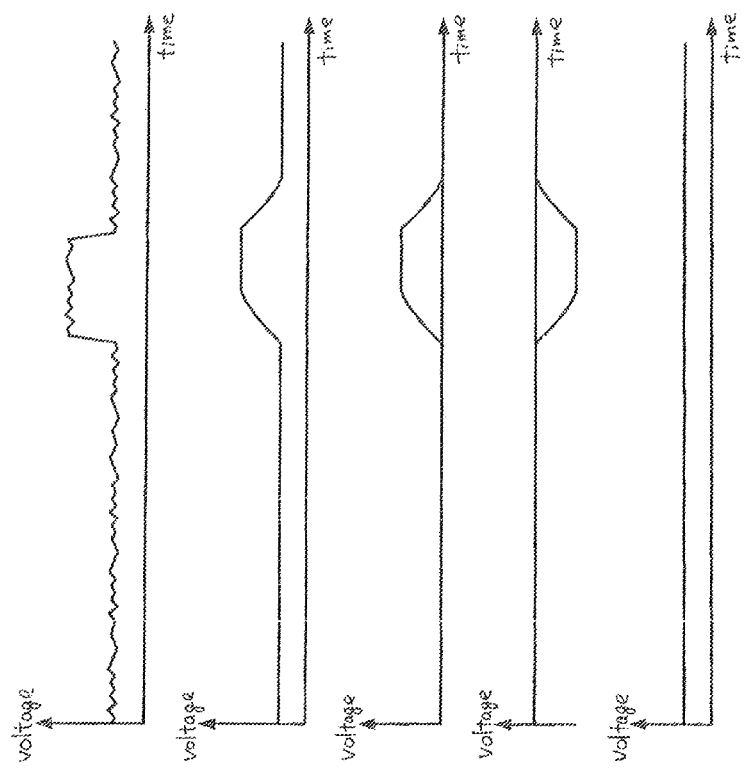
FIG. 9A
FIG. 9B
FIG. 9C
FIG. 9D
FIG. 9E

ELECTRON MICROSCOPE AND METHOD OF OPERATING THE SAME

BACKGROUND OF THE INVENTION

Field of the Invention

The present invention relates to an electron microscope and method of operating it.

Description of Related Art

Generally, electrons released from a field-emission electron gun contain a fluctuation portion representing several percent of the total amount, because gas is adsorbed onto the emitter surface and adsorbed gas and ions migrate, varying the work function of the metal surface and because ion bombardment varies the metal surface morphology. Therefore, where a field-emission electron gun is used in a scanning transmission electron microscope (STEM), emission noise on the image is removed by placing a detector for noise cancellation in the electron optical column, detecting near electrons forming a probe to thereby form an electron signal, and dividing a signal released from the sample by the electron signal. This noise cancellation technique is disclosed, for example, in JP-A-5-307942.

FIG. 13 shows the configuration of a scanning transmission electron microscope (STEM), 101, having a general noise canceling function. This microscope 101 has an electron optical column 110 in which a cold field-emission gun (CFEG) 111, a noise canceling aperture 112, a lens 113, another lens 114, a detector 115, a preamplifier circuit 120, an amplifier circuit 130, and other components are housed. The electron beam released from the CFEG 111 is partially cut off by the noise canceling aperture 112 and then converged onto a sample A by the lens 113. The beam transmitted through the sample A passes through the lens 114 and is partially detected by the detector 115. The output signal from the detector 115 indicative of an image is the product of an emission current I1 hitting the sample A and the brightness component S of the sample A, i.e., I1×S. The emission current I1 hitting the sample A and an emission current I2 detected by the noise canceling aperture 112 are in a proportional relationship (I1=n×I2). An offset component is added to the image signal (I1×S) by the preamplifier circuit 120 and the resulting sum is amplified by a factor of Gp and further amplified by a factor of Ga by the amplifier circuit 130. The emission current I2 detected by the noise canceling aperture 112 is amplified by a factor Gn by a noise detection circuit 140. Where the noise canceling function is not used, the output signal from the amplifier circuit 130 is made to bypass a noise canceling circuit 150, and is computationally processed in a given manner by a central processing section (CPU) 160. Then, the signal is sent to a personal computer (PC) 102, where an STEM image of the sample A is displayed on its display screen. Where the noise canceling function is used, the noise cancelling circuit 150 produces the difference between the output signal from the amplifier circuit 130 and the offset component added by the preamplifier circuit 120. This difference is divided by the output signal from the noise detection circuit 140. Consequently, the emission noise contained in the image signal is removed. The image signal free of the emission noise is computationally processed in a given manner by the processing section (CPU) 160 and then sent to the personal computer (PC) 102, where an STEM image of the sample A free of the emission noise is displayed on its display screen of the PC 102.

FIG. 14 shows one specific example of the configuration of signal processing circuitry used when the noise canceling function is not used. As shown, when the noise canceling function is not used, STEM imaging is carried out fundamentally by adjusting two parameters, i.e., contrast and brightness. The contrast is a gain added to the image signal to adjust the light-dark condition. The brightness is a DC voltage added to cancel the offset component of the image signal. In the example of FIG. 14, the image signal S×I1 is obtained from the detector 115 by adjusting the contrast and brightness B is added to the image signal S×I1 by an adder 122 in the preamplifier circuit 120. The resulting sum signal is amplified by a factor of Gp by an amplifier 124. Accordingly, the output signal from the amplifier 124 is given by $$V_{11} = Gp \times (S \times I1 B) \qquad (A)$$

The output signal $V_{11}$ from the amplifier 124 is amplified by a factor of Ga by an amplifier 132 in the amplifier circuit 130. Using Eq. (A) above, the output signal $V_{12}$ from the amplifier 132 is given by $$V_{12} = Ga \times Gp \times (S \times I1 + B) \qquad (B)$$

The analog output signal $V_{12}$ from the amplifier 132 is converted into digital form by an A/D converter 162 in the processing section 160, then averaged or otherwise arithmetically processed, and sent to the PC 102 shown in FIG. 13.

FIG. 15 is a diagram showing a specific example of configuration of signal processing circuitry used when the noise canceling function is used. As shown, when the noise canceling function is used, too, the output signal $V_{12}$ from the amplifier 132 is given by the above Eq. (B). An amplifier 151 of the noise cancelling circuit 150 gives a gain equal to the product of the gain Gp of the amplifier 124 and the gain Ga of the amplifier 132 to the brightness B to cancel the brightness B added by the preamplifier circuit 120. A subtractor 152 subtracts the resulting sum from the output signal $V_{12}$ from the amplifier 132. Using Eq. (B), the output signal $V_{13}$ from the subtractor 152 is given by $$V_{13} = Ga \times Gp \times (S \times I1 + B) - Ga \times Gp \times B \qquad (C)$$
$$= Ga \times Gp \times S \times I1$$

The emission current I2 detected by the noise canceling aperture 112 is converted into a voltage by an amplifier 142 in the noise detection circuit 140 and amplified by a factor of Gn. Therefore, the output voltage from the amplifier 142 is given by $$V_{14} = Gn \times I2 \qquad (D)$$

The output signal $V_{13}$ from the subtractor 152 is applied to the input (X) on the numerator side of a dividing circuit 154. The output signal $V_{14}$ from the amplifier 142 is applied to the input (Y) on the denominator side of the dividing circuit 154. Using Eqs. (C) and (D), the output signal $V_{15}$ from the dividing circuit 154 is given by $$V_{15} = \frac{X}{Y} = \frac{V_{13}}{V_{14}} = \frac{Ga \times Gp \times S \times I1}{Gn \times I2} \qquad (E)$$

To perform the aforementioned subtraction from the output signal $V_{12}$ from the amplifier 132 using the subtractor 152 of the noise canceling circuit 150, an amplifier 155 gives a gain equal to the product of the gain Gp of the amplifier 124 and the gain Ga of the amplifier 132 to the brightness B.

An adder 156 adds the gain to the output signal $V_{15}$ from the dividing circuit 154. Thus, the output signal $V_{16}$ from the adder 156 is given by $$V_{16} = \frac{Ga \times Gp \times S \times I1}{Gn \times I2} + Ga \times Gp \times B \quad (F)$$

$$= S \times \frac{Ga \times Gp}{Gn} \times \frac{I1}{I2} + Ga \times Gp \times B$$

The analog output signal $V_{16}$ from the adder 156 is converted into digital form by the A/D converter 162 in the processing section 160, then averaged or otherwise arithmetically processed, and sent to the PC 102 shown in FIG. 13.

Substituting I1=n×I2 into Eq. (F) results in $$V_{16} = S \times \frac{Ga \times Gp}{Gn} \times n + Ga \times Gp \times B \quad (G)$$

Any of the emission currents I1 and I2 containing emission noise does not exist in the right side of Eq. (G). Consequently, where the noise canceling function is used, values proportional to the brightness component S of the sample A that the operator wants to image in the same way as where there is no emission noise can be obtained.

If the dividing circuit 154 performs a division operation without removing the brightness B added by the preamplifier circuit 120 and without mounting the amplifier 151 or subtractor 152, the output signal $V_{15}$ from the dividing circuit 154 is given by $$V_{15} = \frac{X}{Y} \quad (H)$$

$$= \frac{V_{12}}{V_{14}}$$

$$= \frac{Ga \times Gp \times (S \times I1 + B)}{Gn \times I2}$$

$$= S \times \frac{Ga \times Gp}{Gn} \times n + \frac{Ga \times Gp \times B}{Gn \times I2}$$

It can be seen from Eq. (H) that the emission current I2 is left in the second term of the right side and thus the emission noise cannot be removed.

In the example of FIG. 15, the removal and re-addition of the brightness and the division operation are performed by analog circuits. These processing operations may also be performed by digital computations, in which case measurement of the gain for the brightness that is divided and re-added and adjustments of settings can be carried out automatically.

The conventional noise canceling method described so far has the following problems. First, where a division is performed by an analog circuit (herein referred to as analog division), the emission currents I1 and I2 are in a proportional relationship and the value of the coefficient n is not fixed but varies at all times depending on amounts detected or on various kinds of settings. In order to appropriately divide or re-add the brightness B in Eq. (G), it is necessary to control the factor Gn such that n/Gn is kept constant while maintaining constant Ga and Gp or to control Ga×Gp of the first or second term of Eq. (G) according to variation of n/Gn. Therefore, where the noise canceling function is used, a greater amount of control is needed than where the noise canceling function is not used.

Eq. (B) is about the signal applied to the processing section 160 when the noise canceling function is not used and the Eq. (F) is about the signal applied to the processing section 160 when the noise canceling function is used. In comparing these Eqs. (B) and (F), both agree when 1/(Gn× I2)=1. Therefore, it follows that appropriate brightness is not applied unless 1/(Gn×I2) is equal to unity when the noise canceling function is used. The factor Gn is fixed for the circuit gain but the emission current I2 decreases according to decrease (see FIG. 16) of the emission current of the CFEG 111, as a matter of course. Besides, the value of the emission current I2 will vary when various settings are modified. Therefore, appropriate brightness cannot be removed or re-added unless the factor Gn is controlled appropriately. Brightness which is removed or re-added can be made to assume an appropriate value in the same way by adjusting other gain. In any case, an adjustment is needed whenever some setting or other is modified. In addition to difficulties with adjustments, other problems occur. That is, the value of contrast and the value of brightness are affected depending on whether the noise canceling function is used or not, unless 1/(Gn×I2) is equal to 1. This will increase the number of adjustments. If 1/(Gn×I2) is much greater than 1, the S/N of the image signal will deteriorate. Conversely, if 1/(Gn×I2) is much smaller than 1, the ability to remove the emission noise will be impaired.

Where a division is performed by making use of a digital computation, problems take place similarly to the case of analog division, but the gain can be automatically adjusted prior to final outputting by performing internal computations. However, neither the gain nor the brightness can be varied between the beginning and the end of scanning because an image is observed. Automated adjustments can be performed only in restricted applications. If manual adjustments are made, it can be said that there are no great differences with analog division. In the case of digital division, a division is performed after an analog to digital conversion and so the range of inputtable voltages is narrow. Hence, the digital division provides less versatility than the analog division.

Generally, any brightness adjustments are not made in response to emission current decreases unless the emission current decreases below a preset lower limit, whether the division technique is analog type or digital type. Accordingly, as shown in FIG. 16, where a lower limit giving Gn×I2<1 is set, a division operation consisting of dividing by a value greater than 1, a division operation consisting of dividing by 1, and a division operation consisting of dividing a value less than 1 are performed in succession with the lapse of time from the instant when memory flushing is triggered.

SUMMARY OF THE INVENTION

In view of the foregoing problems, the present invention has been made. According to some aspects of the present invention, an electron microscope can be offered which can achieve a noise canceling method capable of being adjusted more easily than the conventional analog division without being affected by decreases in emission current. Also, a method of operating this electron microscope can be offered.

(1) An electron microscope associated with the present invention has an electron beam source for producing an electron beam, an electron beam detecting portion for detecting a part of the electron beam, a DC component extracting portion for extracting DC components of an output signal from the electron beam detecting portion, an image detecting portion for detecting a signal obtained in response to impingement of the electron beam on a sample, a division portion for performing a division based on an output signal from the image detecting portion and on an output signal from the electron beam detecting portion, and a multiplication portion for performing a multiplication of a signal indicative of the result of the division performed by the division portion and a signal extracted by the DC component extracting portion.

For example, the signal created by impingement of the electron beam on the sample may be a signal created based on an electron beam transmitted through the sample or a signal created based on electrons released from the sample in response to impingement of the electron beam on the sample.

Where the output signal from the image detecting portion contains an offset signal, for example, the division portion may subtract the offset signal from the output signal from the image detecting portion and dividing this difference signal by the output signal from the electron beam detecting portion. Where the output signal from the image detecting portion contains no offset signal, the division portion may divide the output signal from the image detecting portion by the output signal from the electron beam detecting portion.

According to the electron microscope associated with the present invention, the ratio of the amount of the electron beam detected by the electron beam detecting portion to the magnitude of the signal obtained by impingement of the electron beam on the sample varies according to various settings of the illumination system, imaging system, and detection system. Therefore, the DC component obtained as a result of the division performed by the division portion is varied. The signal indicative of the result of the division is multiplied by the DC component of the output signal from the electron beam detecting portion by the multiplication portion. Thus, the fluctuation portion can be compensated for. As a result, even when a noise canceling function is used, a noise-canceled image can be obtained by providing control similar to control provided where the noise canceling function is not used. During use, neither the contrast nor the brightness needs to be varied by switchingly enabling and disabling the noise canceling function.

Accordingly, the electron microscope associated with the present invention can achieve a noise cancellation method that can be adjusted more easily than the conventional analog division technique without being affected by decreases in emission current.

(2) Another electron microscope associated with the present invention is based on the electron microscope (1) above and further characterized in that the DC component extracting portion may calculate an effective value of the output signal from the electron beam detecting portion, taken over a given period of time.

According to this electron microscope, only the DC components can be extracted by calculating the effective value of the output signal from the electron beam detecting portion and removing the AC components contained in this output signal.

(3) A further electron microscope associated with the present invention is based on the electron microscope (2) above and further characterized in that the given period of time may be set to be long enough to obtain one frame of image containing an image of the sample based on the signal obtained in response to impingement of the electron beam on the sample.

According to this electron microscope, by appropriately setting the given period of time, variations in the results of the calculation of the effective value can be suppressed if relatively low frequency AC components are contained in the output signal from the electron beam detecting portion.

(4) An additional electron microscope associated with the present invention is based on the electron microscope (1) above and further characterized in that the DC component extracting portion may integrate an output signal from the electron beam detecting portion, remove DC components of the integral output signal to thereby produce a second integral signal, produce a third integral signal opposite in polarity to the second integral signal, and sum up the second and third integral signals.

According to this electron microscope, AC components of relatively high frequencies contained in the output signal from the electron beam detecting portion can be removed by integrating this output signal from the electron beam detecting portion. In addition, AC components of the integral output signal are removed to thereby produce a second integral signal. A third integral signal opposite in polarity to the second integral signal is produced. The second and third integral signals are summed up. Consequently, AC components of relatively low frequencies that have not been fully removed by the integrator can be removed. Hence, only DC components can be extracted by removing AC components contained in the output signal from the electron beam detecting portion.

(5) A still other electron microscope associated with the present invention is based on any one of (1)-(4) above and further characterized in that processing performed by the DC component extracting portion, the division portion, and the multiplication portion may be performed by digital computations.

(6) A method of operating an electron microscope in accordance with the present invention starts with detecting a part of an electron beam generated by an electron beam source to thereby produce a first signal. DC components of the first signal are extracted to thereby produce a second signal. A signal obtained by impingement of the electron beam on a sample is detected to produce an image signal. A division is performed based on the image signal and on the first signal. A signal indicative of the result of the division is multiplied by the second signal.

BRIEF DESCRIPTION OF THE DRAWINGS

FIGS. 3A-3J are graphs of examples of signal waveforms appearing at various nodes of the signal processing circuitry shown in FIG. 2.

FIG. 4A is a graph showing one example of noise signal.

FIG. 4B is a graph showing one example of output signal from an effective value calculating circuit.

FIG. 8 is a circuit diagram of a filter circuit.

FIGS. 9A-9E are graphs of examples of signal waveforms appearing at various nodes of the filter circuit shown in FIG. 8.

DESCRIPTION OF THE INVENTION

The preferred embodiments of the present invention are hereinafter described in detail with reference to the drawings. It is to be understood that the embodiments described below do not unduly restrict the contents of the present invention delineated by the claims and that not all the configurations described below are essential constituent components of the invention.

In the following, a scanning transmission electron microscope (STEM) is taken as one example of electron microscope associated with the present invention. The present invention can also be applied to other electron microscopes such as a scanning electron microscope (SEM).

1. First Embodiment

Figure 1:
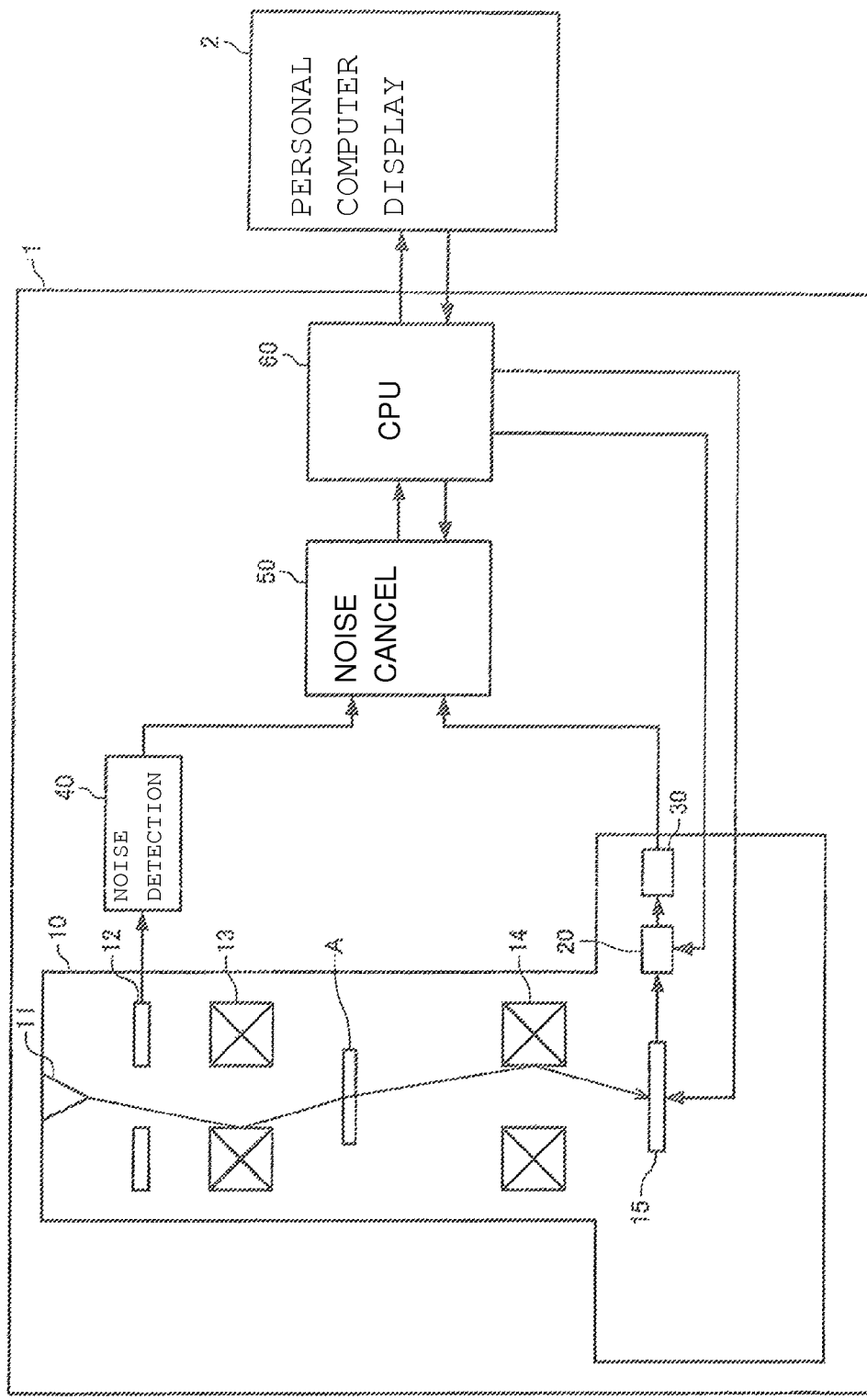
FIG. 1 is a block diagram showing one example of configuration of an electron microscope according to a first embodiment of the present invention.

FIG. 1 shows one example of configuration of an electron microscope according to a first embodiment of the present invention. This microscope is generally indicated by reference numeral 1 and configured including an electron optical column 10, a noise detecting circuit 40, a noise canceling circuit 50, and a processing section (CPU) 60. An electron beam source 11, a noise canceling aperture 12, lenses 13, 14, a detector 15, a preamplifier circuit 20, an amplifier circuit 30, and other components are housed in the electron optical column 10. The electron microscope 1 is a scanning transmission electron microscope (STEM). Other types of lenses and apertures (not shown) are housed in the column 10. Some of the constituent elements of the electron microscope 1 of the present embodiment shown in FIG. 1 may be omitted, some modifications may be made to the constituent elements, or other constituent elements may be added.

The electron beam released from the electron beam source 11 is partially cut off by the noise canceling aperture 12 and then converged onto a sample A by the lens 13. A well-known electron gun such as a CFEG (cold-field emission gun) can be used as the electron beam source 11.

The electron beam transmitted through the sample A passes through the lens 14 and is partially detected by the detector 15. An image signal detected by the detector 15 is the product of the emission current I1 hitting the sample A and the brightness component S of the sample A, i.e., I1×S.

The noise canceling aperture 12 detects the emission current (noise signal). For example, any illumination aperture disposed between the electron beam source 11 and the sample A such as a condenser aperture may also be used as the noise canceling aperture 12 in the electron optical column 10. Apart from the illumination aperture, a dedicated noise canceling aperture 12 may also be mounted. The emission current I2 detected by the noise canceling aperture 12 is amplified by the noise detecting circuit 40.

Utilizing that the emission current I1 hitting the sample A and the emission current I2 detected by the noise canceling aperture 12 are in a proportional relationship (I1=n×I2), the noise canceling circuit 50 removes (or correctly, reduces) the noise signal superimposed on the output signal from the amplifier circuit 30. The signal free of the noise signal is arithmetically processed in a given manner by the processing section 60 and then sent to the personal computer (PC) 2. An STEM image of the sample A is displayed on the display screen of the PC 2 and stored.

Figure 2:
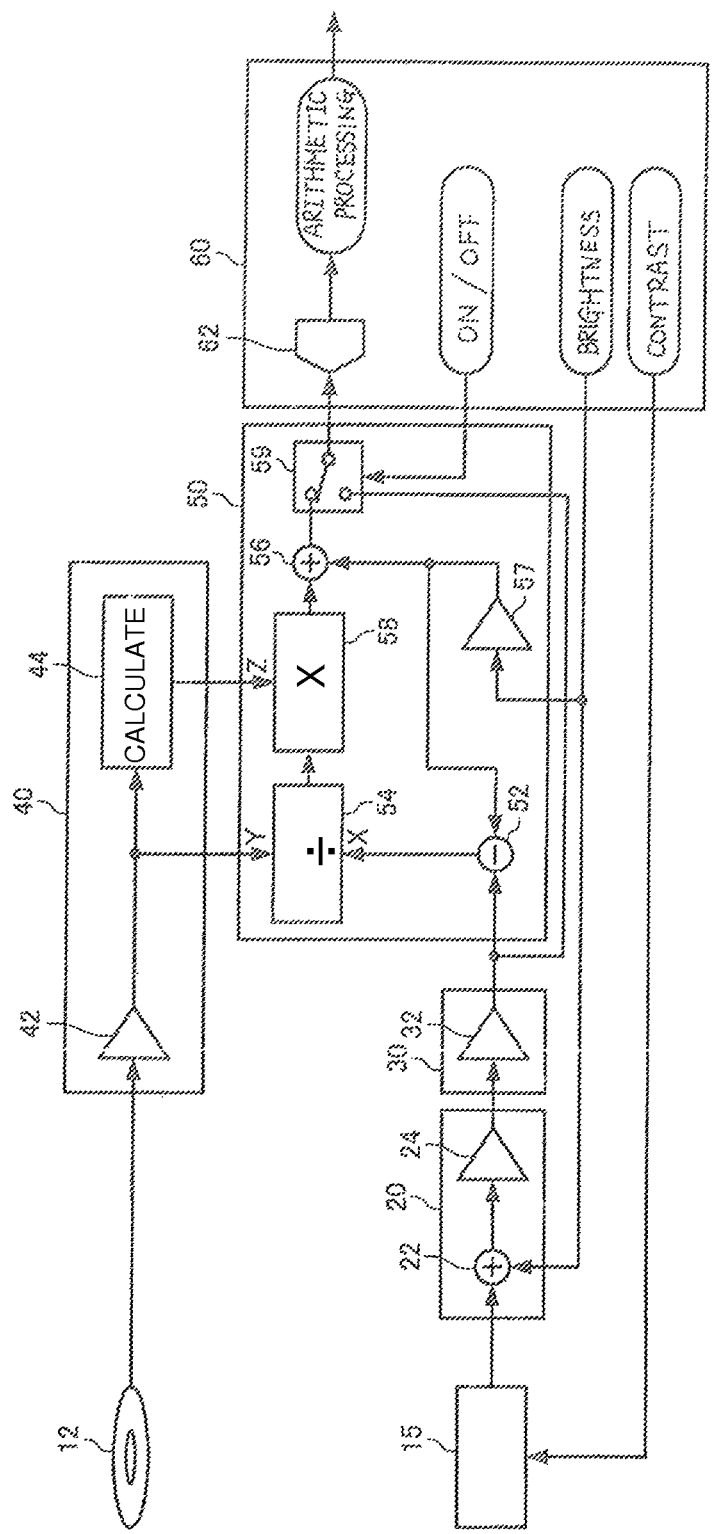
FIG. 2 is a block diagram showing one specific example of configuration of signal processing circuitry included in the electron microscope shown in FIG. 1.

FIG. 2 is a diagram showing one specific example of configuration of signal processing circuitry used in the present embodiment. In both FIGS. 1 and 2, like constituent elements are indicated by like reference numerals. FIGS. 3A-3J are graphs showing examples of signal waveforms appearing at various nodes of the circuitry of FIG. 2.

In the present embodiment, as shown in FIG. 2, the processing section 60 switches the status of a switch circuit 59 so that the noise canceling function can be enabled and disabled under control from the PC 2 shown in FIG. 1.

When the noise canceling function is inactive, the output signal from the amplifier circuit 30 is applied to the processing section 60 via the switch circuit 59. Accordingly, where the noise canceling function is inactive, STEM imaging is performed fundamentally using only two adjustments, i.e., contrast and brightness. The contrast is a gain applied to the image signal for adjusting the degree of lightness or darkness. In the present embodiment, contrast is set into the detector 15. The brightness is a DC voltage applied to cancel the offset component of the image signal. In the present embodiment, brightness is set into the preamplifier circuit 20.

In the present embodiment, the preamplifier circuit 20 is configured including an adder 22 and an amplifier 24. Brightness B is added by the adder 22 to an image signal S×I1 (see FIG. 3A) obtained from the detector 15 by adjusting the contrast and then the resulting sum signal is amplified by a factor of Gp by the amplifier 24. Accordingly, the output signal $V_1$ (see FIG. 3B) from the amplifier 24 (output signal from the preamplifier circuit 20) is given by $$V_1 = Gp \times (S \times I1 + B) \tag{1}$$

In the present embodiment, the amplifier circuit 30 is configured including an amplifier 32. The output signal $V_1$ from the preamplifier circuit 20 is amplified by a factor of Ga by the amplifier 32. Using Eq. (1), the output signal $V_2$ (see FIG. 3C) from the amplifier 32 (output signal from the amplifier circuit 30) is given by $$V_2 = Ga \times Gp \times (S \times I1 + B) \tag{2}$$

The processing section 60 converts the analog output signal from the amplifier circuit 30 into digital form by means of an A/D converter 62, then creates image data by performing arithmetic processing such as averaging, and sends the created data to the PC 2 shown in FIG. 1. For instance, the processing section 60 can be accomplished by a microcomputer. The PC 2 receives the image data created by the processing section 60, writes the received data into a frame buffer, displays an image of the sample A on a display unit, and stores or otherwise processes the data.

On the other hand, when the noise canceling function is active, the output signal $V_2$ from the amplifier circuit 30 is noise-canceled by the noise canceling circuit 50 and then applied to the processing section 60 via the switch circuit 59.

In the present embodiment, the noise canceling circuit 50 is configured including a subtractor 52, a divider circuit 54, an adder 56, an amplifier 57, a multiplier circuit 58, and the switch circuit 59. The amplifier 57 gives a gain (Gp×Ga) equal to the product of the gain Gp of the amplifier 24 and the gain Ga of the amplifier 32 to the brightness B. The subtractor 52 subtracts the output signal (Gp×Ga×B) from the amplifier 57 from the output signal $V_2$ from the amplifier circuit 30. Even when the noise canceling function is active, the output signal $V_2$ from the amplifier circuit 30 is given by Eq. (2) and so the output signal $V_3$ (see FIG. 3D) from the subtractor 52 is given by $$V_3 = Ga \times Gp \times (S \times I1 + B) - Ga \times Gp \times B \qquad (3)$$
$$= Ga \times Gp \times S \times I1$$

As is obvious from Eq. (3), the brightness added by the preamplifier circuit 20 is canceled out in the output signal $V_3$ from the subtractor 52. The output signal $V_3$ from the subtractor 52 is applied to the input (X) of the numerator side of the divider circuit 54. The noise signal detected by the noise detecting circuit 40 is applied to the input (Y) on the denominator side of the divider circuit 54.

In the present embodiment, the noise detecting circuit 40 is configured including an amplifier 42 and an effective value calculating circuit 44. The amplifier 42 converts the emission current I2 (see FIG. 3E) detected by the noise canceling aperture 12 into a voltage and amplifies it by a factor of Gn. Accordingly, the output signal $V_4$ (see FIG. 3F) from the amplifier 42 is given by $$V_4 = Gn \times I2 \qquad (4)$$

The effective value calculating circuit 44 calculates the effective value (RMS) of the output signal $V_4$ from the amplifier 42 over a preset time on a real-time basis. For example, a general-purpose IC may be used as the effective value calculating circuit 44.

The output signal $V_3$ from the subtractor 52 and the output signal $V_4$ from the amplifier 42 are applied to the input (X) on the numerator side and the input (Y) on the denominator side, respectively, of the divider circuit 54 and divides the signal $V_3$ by the signal $V_4$. Therefore, using Eqs. (3) and (4), the output signal $V_5$ (see FIG. 3G) from the divider circuit 54 is given by $$V_5 = \frac{X}{Y} = \frac{V_3}{V_4} = \frac{Ga \times Gp \times S \times I1}{Gn \times I2} \qquad (5)$$

The multiplier circuit 58 multiplies the output signal $V_5$ (see FIG. 3G) from the divider circuit 54 by the output signal $(Gn \times I2)_{RMS}$ (see FIG. 3H) from the effective value calculating circuit 44. Therefore, using Eq. (5), the output signal $V_6$ (see FIG. 3I) from the multiplier circuit 58 is given by $$V_6 = \frac{X}{Y} \times Z = \frac{Ga \times Gp \times S I1}{Gn \times I2} \times (Gn \times I2)_{RMS} \qquad (6)$$

where the emission current I2 is given by $$I2 = I2_{DC} + N \qquad (7)$$

where $I2_{DC}$ is the DC component and N is the noise component.

The output signal $(Gn \times I2)_{RMS}$ from the effective value calculating circuit 44 can be approximated by $$(Gn \times I2)_{RMS} = Gn \times (I2)_{RMS} \cong Gn \times I2_{DC} \qquad (8)$$

The equation I1=I2×n is substituted into Eq. (6). Eqs. (7) and (8) are also substituted. The output signal $V_6$ from the multiplier circuit 58 is approximated by $$V_6 \cong \frac{Ga \times Gp \times S \times (I2_{DC} + N) \times n}{Gn \times (I2_{DC} + N)} \times (Gn \times I2_{DC}) \qquad (9)$$
$$= Ga \times Gp \times S \times I2_{DC} \times n$$

In Eq. (9), $I2_{DC}$ is an ideal DC current obtained by removing the noise component N from the emission current I2, and is an emission current detected by the noise detecting circuit 40 when there is no emission noise. The equation I1=I2×n indicates that $I2_{DC} \times n$ is equivalent to an ideal DC current $I1_{DC}$ obtained by removing the emission current from I1.

Therefore, by substituting the equation $I2_{DC} \times n = I1_{DC}$ into Eq. (9), the output signal $V_6$ from the multiplier circuit 58 is approximated by $$V_6 \cong Ga \times Gp \times S \times I1_{DC} \qquad (10)$$

The adder 56 adds up the output signal $V_6$ from the multiplier circuit 58 and the output signal (Gp×Ga×B) from the amplifier 57. Therefore, the output signal $V_7$ (see FIG. 3J) from the adder 56 is approximated by $$V_7 \cong Ga \times Gp \times S \times I1_{DC} + Ga \times Gp \times B \qquad (11)$$
$$= Ga \times Gp \times (S \times I1_{DC} + B)$$

The output signal $V_7$ from the adder 56 is applied to the processing section 60 via the switch circuit 59. The processing section 60 converts the analog output signal from the adder 56 into digital form by the A/D converter 62, then averages or otherwise arithmetically processes the digital signal to create image data, and sends the image data to the PC 2 shown in FIG. 1. The PC 2 receives the image data created by the processing section 60, writes the data into the frame buffer, and displays an image of the sample A from which the emission noise has been removed or reduced on the display unit, and stores or otherwise processes the data.

$I1_{DC}$ of Eq. (11) is nearly equal in value to the emission current hitting the sample A when there is no emission noise. Consequently, STEM imaging is enabled only with adjustments of the contrast and brightness while Ga, Gp, Gn, and gain given to the brightness that is removed or re-added are kept constant at all times in the same way as when the noise canceling function is inactive.

If the emission current varies with time, a signal obtained by removing only noise from the output signal $V_2$ from the amplifier circuit 30 given by Eq. (2) can be kept obtained because the signal input to the processing section 60 is as given by Eq. (11) at all times.

Eq. (11) representing the signal applied to the processing section 60 when the noise canceling function is active is obtained by replacing I1 of Eq. (2) representing the signal applied to the processing section 60 when the noise canceling function is inactive by $I1_{DC}$. Consequently, it is not necessary to perform cumbersome adjustments whenever the noise canceling function is activated or deactivated.

In the present embodiment, the electron beam source 11 corresponds to the "electron beam source" of the present invention. The noise canceling aperture 12 and amplifier 42 together correspond to the "electron beam detecting portion" of the present invention. The effective value calculating circuit 44 corresponds to the "DC component extracting portion" of the present invention. The detector 15, preamplifier circuit 20, and amplifier circuit 30 together correspond to the "image detecting portion" of the present invention. The divider circuit 54 corresponds to the "division portion" of the present invention. The multiplier circuit 58 corresponds to the "multiplication portion" of the present invention.

As described so far, according to the electron microscope of the first embodiment, the effective value of the noise signal is calculated by the effective value calculating circuit 44. The output signal from the divider circuit 54 is multiplied by the output signal from the effective value calculating circuit 44 by means of the multiplier circuit 58. Consequently, the gain of the noise canceling circuit 50 can be determined irrespective of the image signal. Thus, if various settings in the illumination system, imaging system, and detection system are modified for imaging, the gain can be maintained constant. The gain will vary only when the beam current located above the noise canceling aperture 12 is varied. Because the effective value of the noise signal is being computed, an image signal of unity magnification that has been noise-canceled can be obtained after a given time (from several seconds to tens of seconds) that is set in the circuitry if no manipulations are performed. This dispenses with adjustment of the gain. If a CFEG (cold-field emission gun) is used as the electron beam source 11, an image free from emission noises can be observed by performing manipulations similar to manipulations of a Schottky emission gun.

According to the electron microscope of the present embodiment, a division is performed using analog signals and so it is easy to make a connection with an external device. More latitude is allowed in determining a range of input voltages than when a division is performed using digital computations. The technique of the present embodiment can cancel emission noises detected with numerous electron microscope-related detectors available on the market and, therefore, much greater versatility is offered.

As described so far, according to the present embodiment, an electron microscope can be offered which can eliminate difficulties with adjustments heretofore encountered when conventional analog division techniques are used without being affected by decreases in emission current and which achieves a noise canceling function having greater versatility than digital division techniques.

As shown in FIG. 4A, the output signal (noise signal) from the amplifier 42 contains emission noises (low-frequency noises) (noises persisting over a period from $t_1$ to $t_2$ of FIG. 4A) persisting over a long period and affecting several lines of image and emission noises (high-frequency noises) persisting over a short period and affecting only one line of image. Therefore, as the time taken by the effective value calculating circuit 44 to calculate the effective value shortens, the result of the calculation of the effective value varies to a greater extent. As a result, the ability to cancel noise deteriorates. Accordingly, the time taken by the effective value calculating circuit 44 to calculate the effective value is preferably set equal to or longer than the time (on the order of seconds) for the PC 2 taken to obtain one page of image (STEM image) of the sample A, for example. Thus, if there exists noise that persists over a long period of $t_1$ to $t_2$ as shown in FIG. 4A, for example, the output signal from the effective value calculating circuit 44 varies only slightly during a period of $t_1$ to $t_3$ as shown in FIG. 4B. Hence, the ability to cancel noise little deteriorates.

2. Second Embodiment

Figure 5:
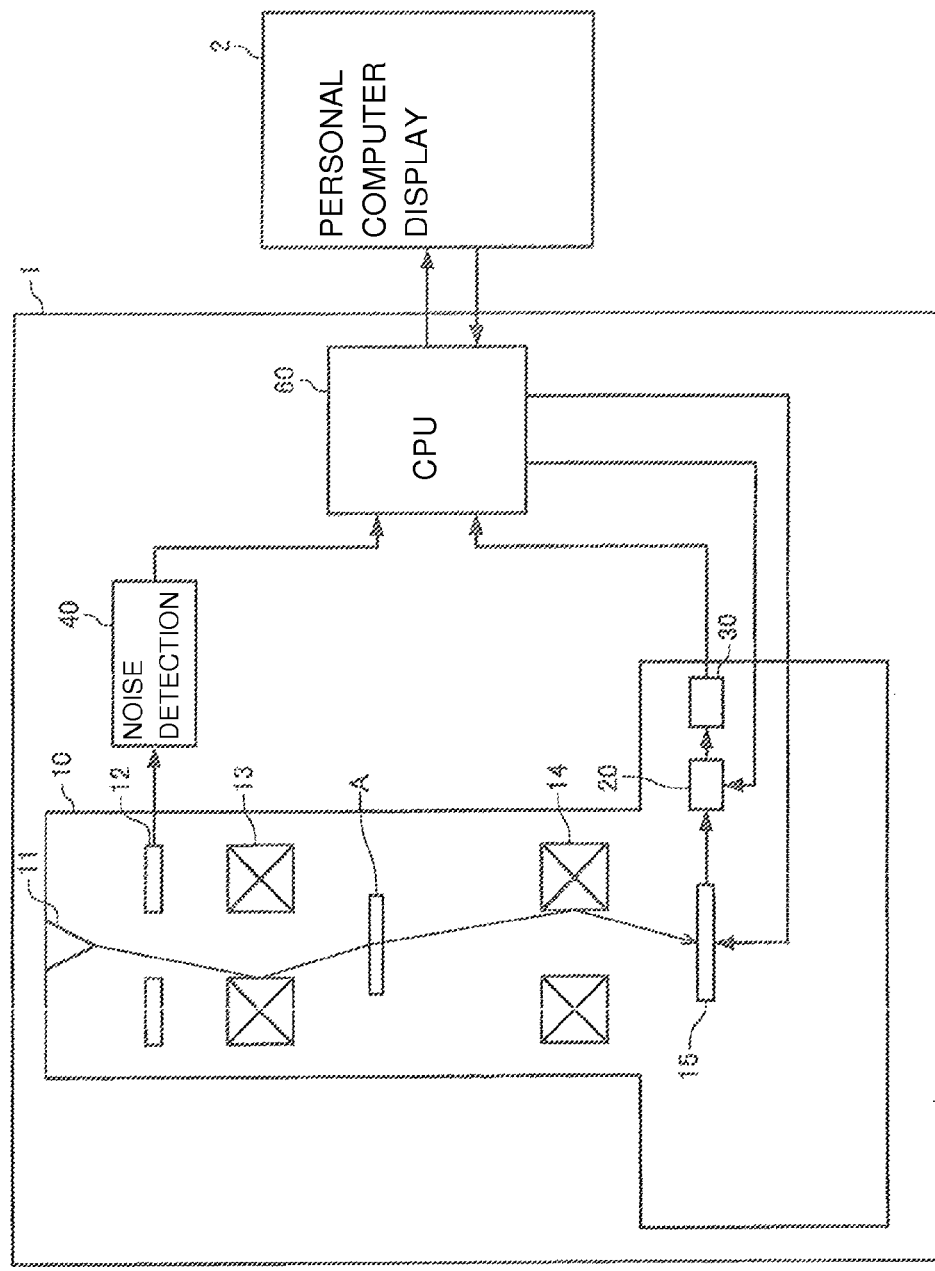
FIG. 5 is a block diagram showing one example of configuration of an electron microscope according to a second embodiment of the present invention.
Figure 6:
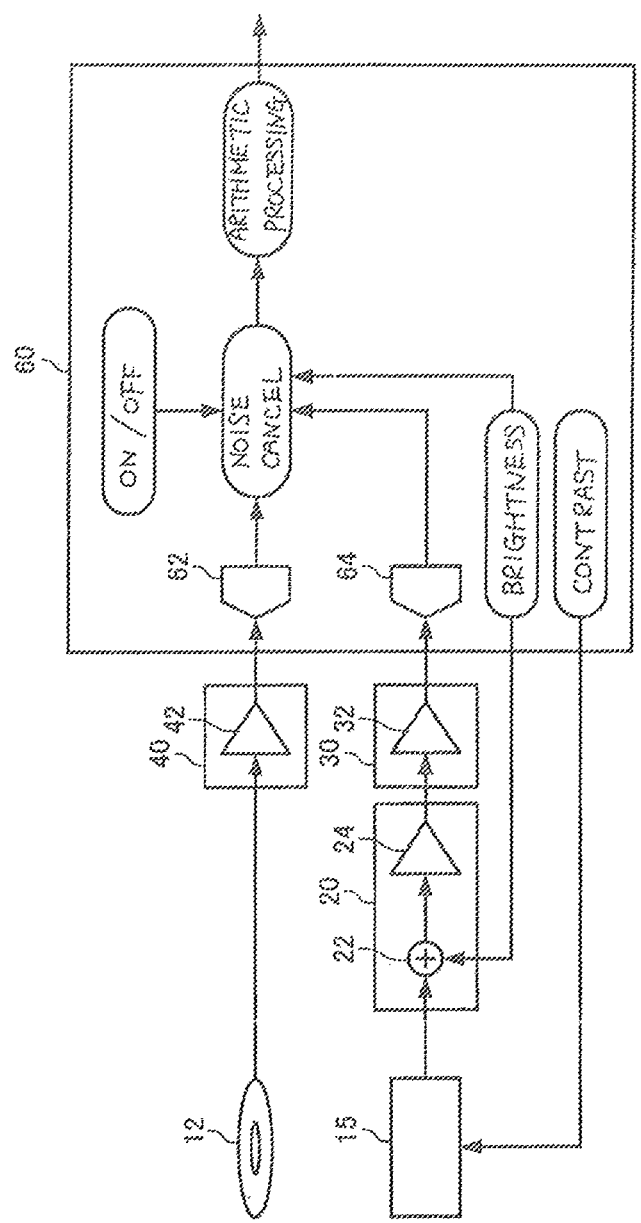
FIG. 6 is a block diagram showing one specific example of configuration of signal processing circuitry included in the electron microscope shown in FIG. 5.

FIG. 5 is a diagram showing one example of configuration of an electron microscope according to a second embodiment of the present invention. FIG. 6 is a diagram showing one specific example of configuration of signal processing circuitry included in the microscope shown in FIG. 5. In FIGS. 5 and 6, the constituent elements which are the same as their counterparts shown in FIGS. 1 and 2 are indicated by the same reference numerals as in FIGS. 1 and 2 and their description is omitted. As shown in FIGS. 5 and 6, the electron microscope 1 of the second embodiment is similar to the electron microscope 1 of the first embodiment shown in FIGS. 1 and 2 except that the effective value calculating circuit 44 and the noise canceling circuit 50 are omitted and that the processing section 60 implements a noise canceling function (i.e., calculation of an effective value, subtraction of an offset value, division, multiplication, and addition of an offset value) by digital computations.

In the present embodiment, the output signal from the amplifier 42 and the output signal from the amplifier 32 are applied to the processing section 60 and converted into digital form by A/D converters 62 and 64, respectively. The processing section 60 calculates the effective value of the output value from the A/D converter 62 over a preset time by digital computation. The offset added to the image signal by the preamplifier circuit 20 is amplified by the amplifiers 24 and 32. The processing section 60 subtracts the resulting value (Gp×Ga×B) from the output value from the A/D converter 64 by digital computation, and divides this difference by the output value from the A/D converter 62 similarly to Eq. (5). Also, the processing section 60 performs a multiplication of the result of the division (quotient) and the result of the calculation of the effective value $(Gn \times I2)_{RMS}$ similarly to Eq. (6) by digital computation. Furthermore, the processing section 60 adds the subtracted value (Gp×Ga×B) to the product by digital computation. Then, the processing section 60 averages or otherwise arithmetically processes the resulting slim and sends the result to the PC 2 shown in FIG. 5.

In the present embodiment, the electron beam source 11 corresponds to the "electron beam source" of the present invention. The noise canceling aperture 12 and the amplifier 42 together correspond to the "electron beam detecting portion" of the present invention. The detector 15, the preamplifier 20, and the amplifier circuit 30 together correspond to the "image detecting portion" of the present invention. The processing section 60 corresponds to all of the "DC component extracting portion", the "division portion", and the "multiplication portion" of the present invention.

The electron microscope of the second embodiment described so far can yield the same advantageous effects as the first embodiment.

3. Third Embodiment

Figure 7:
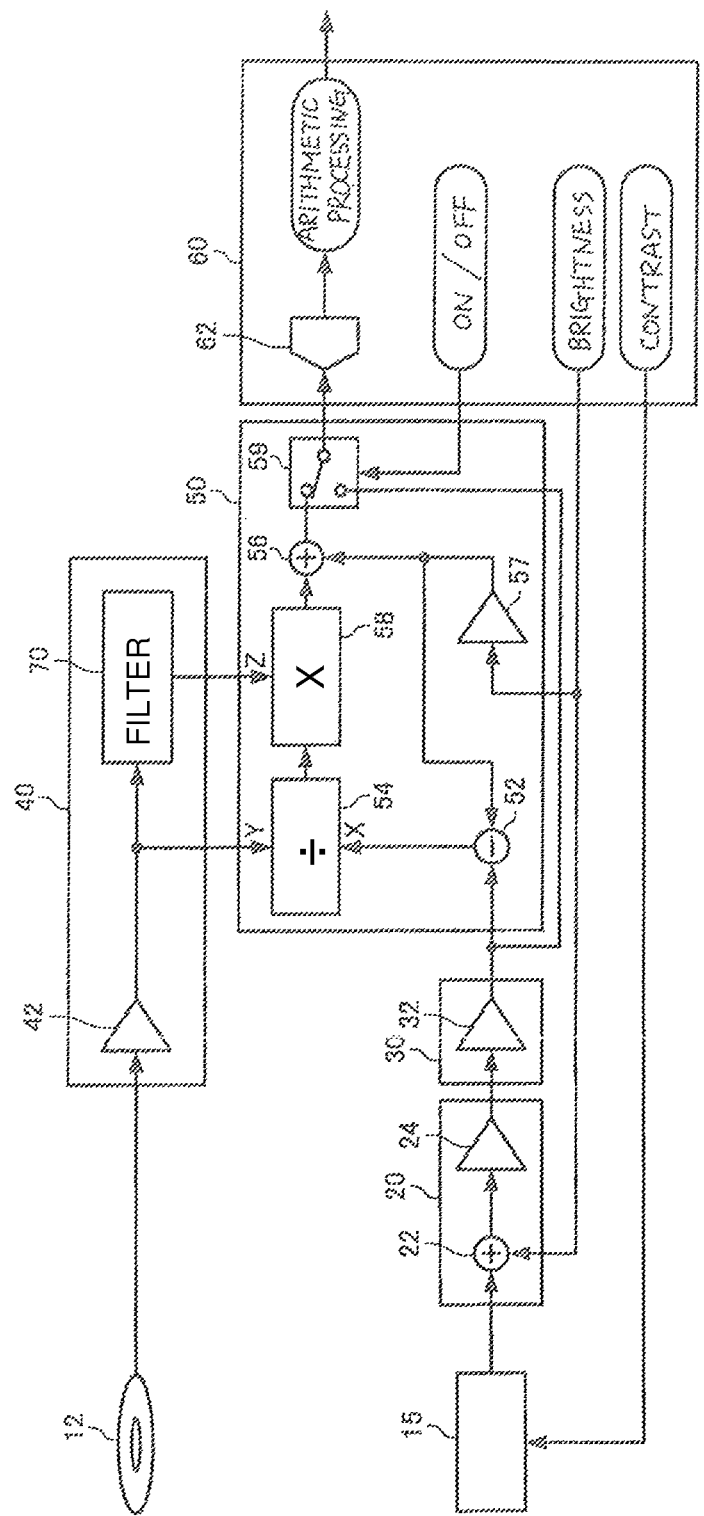
FIG. 7 is a block diagram showing one specific example of configuration of signal processing circuitry included in an electron microscope according to a third embodiment of the invention.

FIG. 7 is a diagram showing a specific example of configuration of signal processing circuitry in a third embodiment of the present invention. In both FIGS. 2 and 7, like constituent components are indicated by like reference numerals and their description is omitted. An electron microscope according to the third embodiment is similar in configuration with the microscope of FIG. 1 and so the microscope according to the third embodiment is neither illustrated nor described. As shown in FIG. 7, an electron microscope according to the third embodiment is similar in configuration with the electron microscope or the first embodiment shown in FIG. 2 except that the effective value calculating circuit 44 has been replaced by a filter circuit 70. The filter circuit 70 removes AC components from a noise signal amplified by a factor of Gn by the amplifier 42 and extracts DC components.

FIG. 8 is a diagram showing one example of configuration of the filter circuit 70. FIGS. 9A-9E show examples of signal waveforms appearing at various nodes of the circuit of FIG. 8. In the example of FIG. 8, the filter circuit 70 is configured including an integrating circuit 71, a capacitor 72, an inverting amplifier circuit 73, an adder circuit 74, and a non-inverting amplifier circuit (voltage follower) 75.

The integrating circuit 71 receives the output signal (see FIG. 9A) from the amplifier 42 of FIG. 7 and outputs a signal of a voltage level that is averaged by integration.

The capacitor 72 is used to cut off DC components. The capacitor 72 removes DC components from the output signal (see FIG. 9B) from the integrating circuit 71 and extracts AC components.

The inverting amplifier circuit 73 inverts the signal (see FIG. 9C) (amplifies it by a factor of −1) passed through the capacitor 72 relative to a given reference voltage.

The adder circuit 74 sums up the output signal (see FIG. 9B) from the integrating circuit 71 and the output signal (see FIG. 9D) from the inverting amplifier circuit 73.

The non-inverting amplifier circuit 75 buffers and outputs the output signal (see FIG. 9E) from the adder circuit 74. The output signal from the non-inverting amplifier circuit 75 is applied to the multiplier circuit 58 of FIG. 7.

In the low-pass filter 70 of the example of FIG. 7, emission noises (RF noises) contained in the output signal from the amplifier 42 and persisting over short periods are removed by the integrating circuit 71. Emission noises (low-frequency noises) contained in the output signal from the amplifier 42 and persisting over long periods are removed by the capacitor 72, inverting amplifier circuit 73, and adder circuit 74. Accordingly, as shown in FIG. 9E, the output signal from the non-inverting amplifier circuit 75 is ideally a constant DC voltage. In practice, because of a delay time of the output signal from the integrating circuit 71 passing through the capacitor 72 and the inverting amplifier circuit 73, the output signal from the integrating circuit 71 and the output signal from the inverting amplifier circuit 73 slightly deviate from each other in timing of addition. Therefore, the output signal from the non-inverting amplifier circuit 75 varies transiently for a quite short time but the effects are negligibly small. To prevent the timing at which the output signal from the integrating circuit 71 is applied from deviating from the timing at which the output from the inverting amplifier circuit 73 is applied, a delay circuit (phase shifter) may be inserted between the integrating circuit 71 and the adder circuit 74.

In the present embodiment, the electron beam source 11 corresponds to the "electron beam source" of the present invention. The noise canceling aperture 12 and the amplifier 42 together correspond to the "electron beam detecting portion" of the present invention. The filter circuit 70 corresponds to the "DC component extracting portion" of the present invention. The detector 15, preamplifier circuit 20, and amplifier circuit 30 together correspond to the "image detecting portion" of the present invention. The divider circuit 54 corresponds to the "division portion" of the present invention. The multiplier circuit 58 corresponds to the "multiplication portion" of the present invention.

According to the electron microscope of the third embodiment described so far, the output signal from the low-pass filter 70 can be kept at a constant voltage in the same way as for the effective value calculating circuit 44 of the first embodiment. Consequently, the electron microscope of the third embodiment can yield the same advantageous effects as the first embodiment.

4. Fourth Embodiment

Figure 10:
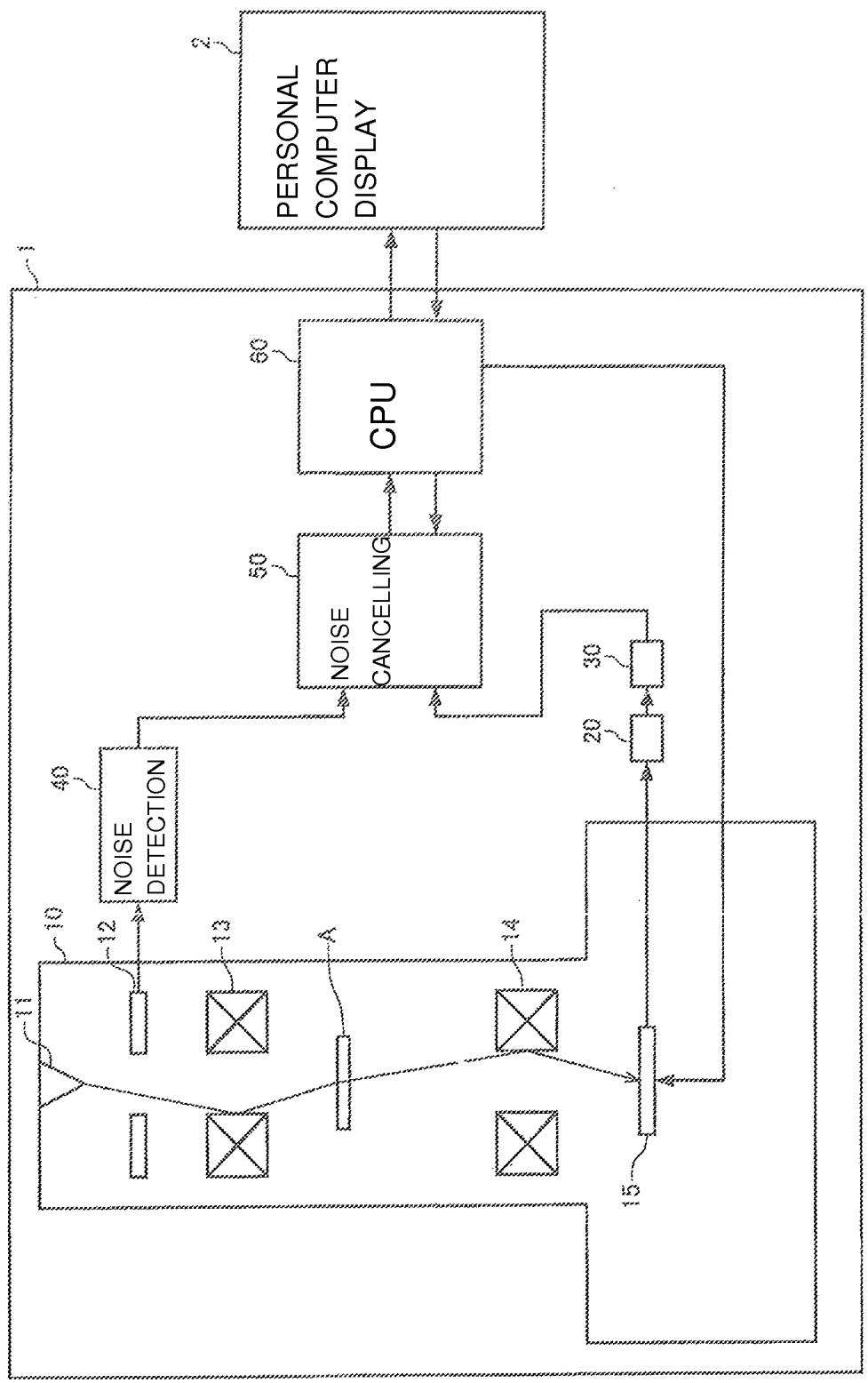
FIG. 10 is a block diagram showing one example of configuration of an electron microscope according to a fourth embodiment of the invention.

FIG. 10 is a diagram showing an example of configuration of an electron microscope of a fourth embodiment of the present invention. In both FIGS. 1 and 10, like constituent elements are indicated by like reference numerals and their description is omitted. As shown in FIG. 10, the electron microscope 1 of the fourth embodiment is similar in configuration with the electron microscope 1 of the first embodiment shown in FIG. 1 except that the preamplifier circuit 20 and amplifier circuit 30 are mounted outside the electron optical column 10. In the electron microscope 1 of the first embodiment, an offset signal is added to the image signal in the preamplifier circuit 20 mounted inside of the electron optical column 10 for brightness adjustments, and noise cancellation is performed by making use of the output signal from a terminal of the column 10. Therefore, before division and multiplication are performed by the noise canceling circuit 50, cumbersome processing consisting of subtracting a signal corresponding to the offset signal, performing division and multiplication, and then adding the offset signal again is performed. In contrast, in the electron microscope of the fourth embodiment, the preamplifier circuit 20 and amplifier circuit 30 are mounted outside the electron optical column 10. An offset signal is added for brightness adjustment by the noise canceling circuit 50. Thus, noise cancellation is achieved by a simpler structure.

Figure 11:
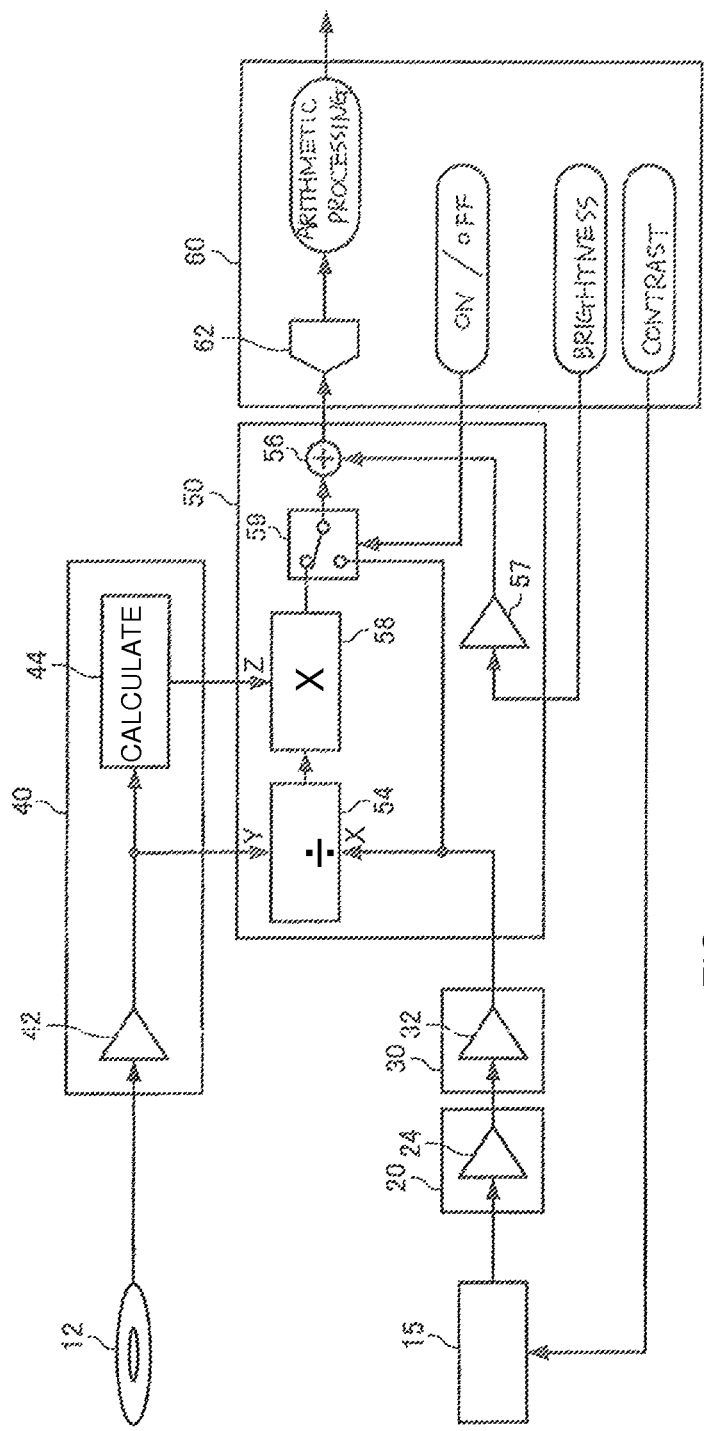
FIG. 11 is a block diagram showing one specific example of configuration of signal processing circuitry included in the electron microscope shown in FIG. 10.
Figure 12:
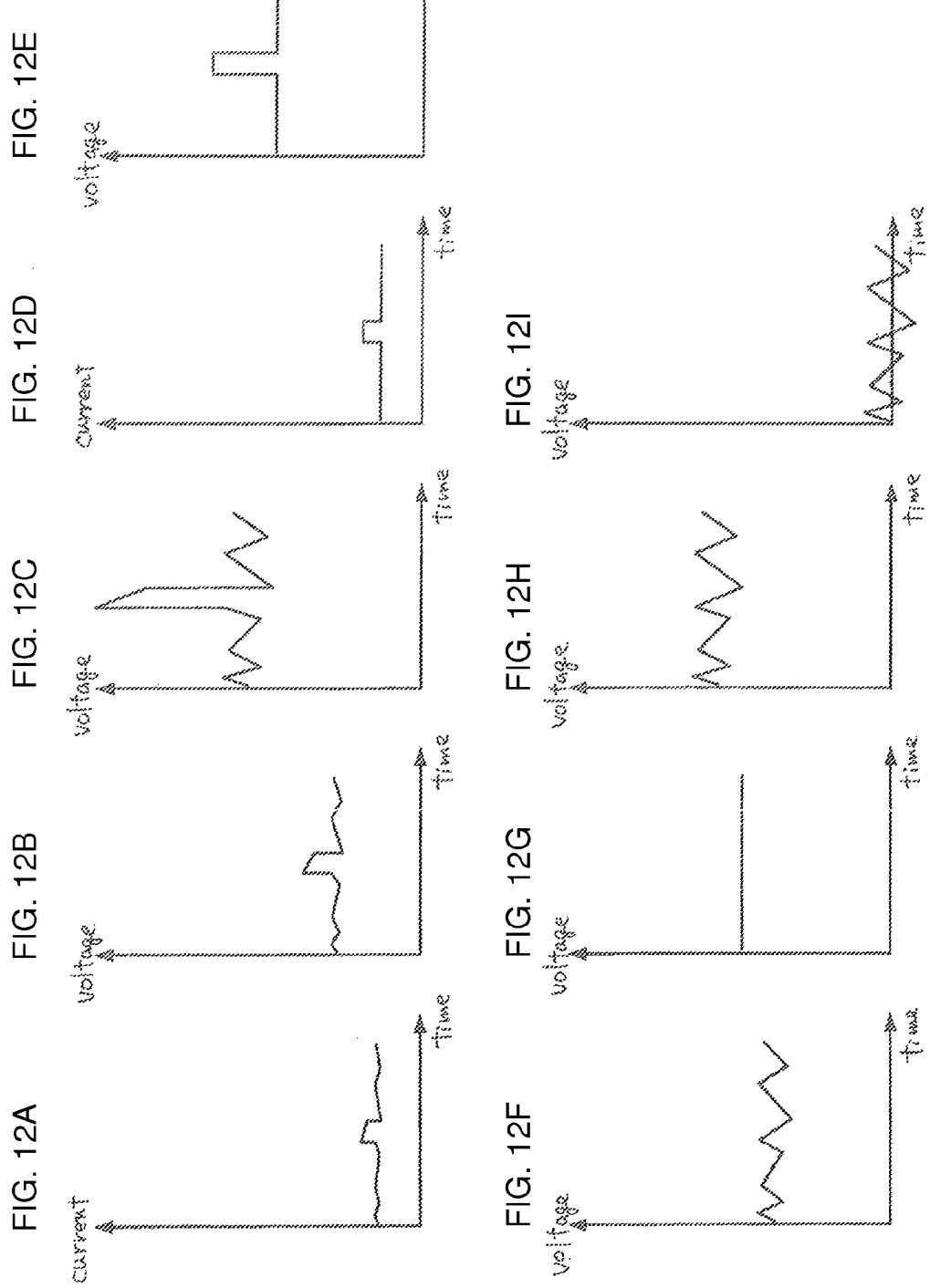
FIGS. 12A-12I are graphs of examples of signal waveforms appearing at various nodes of the signal processing circuitry shown in FIG. 11.
Figure 13:
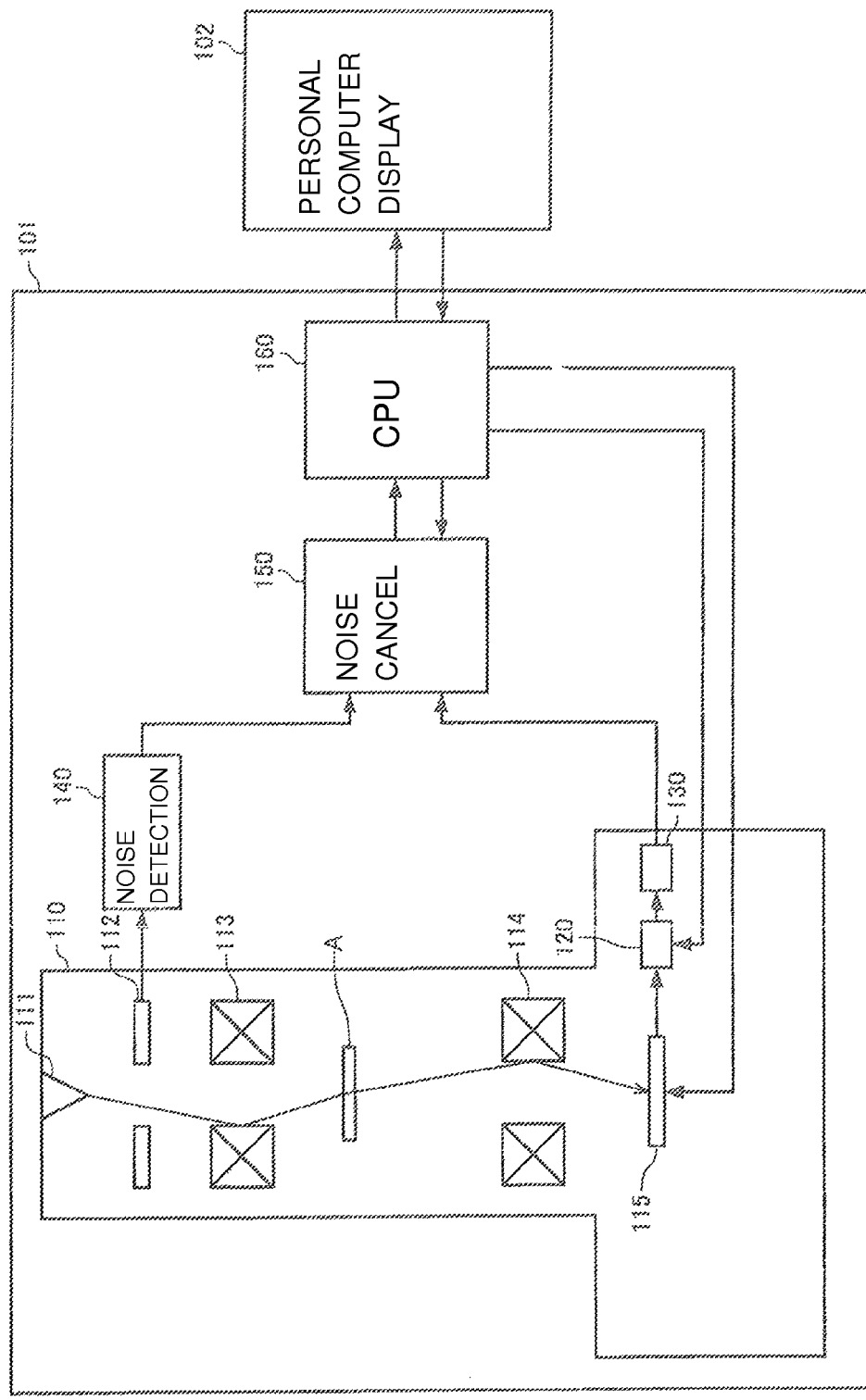
FIG. 13 is a block diagram of a scanning transmission electron microscope (STEM) having a general noise canceling function.
Figure 14:
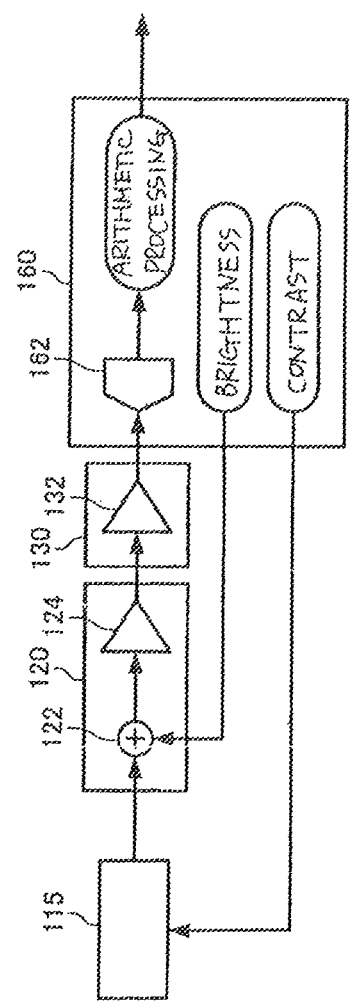
FIG. 14 is a circuit diagram showing one specific example of configuration of signal processing circuitry included in a conventional electron microscope when no noise canceling function is used.
Figure 15:
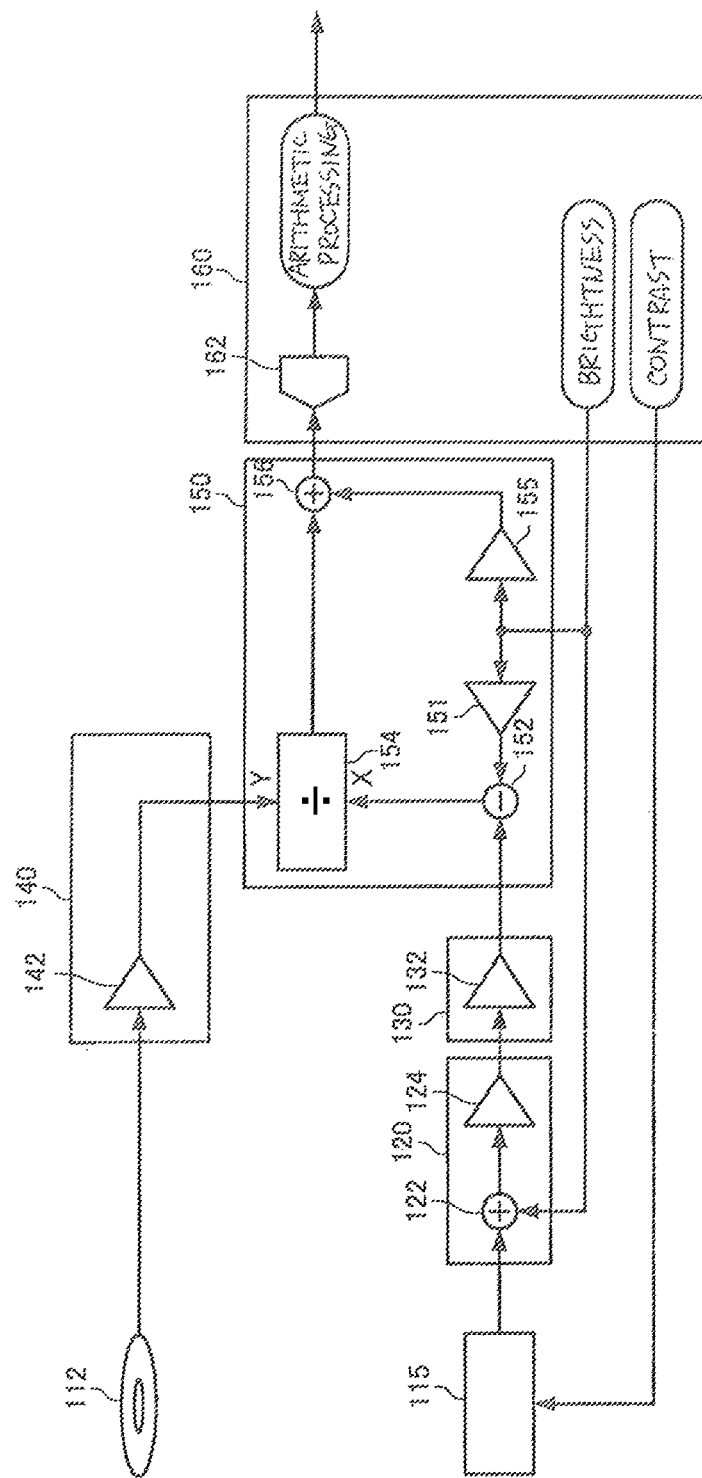
FIG. 15 is a circuit diagram showing one specific example of configuration of signal processing circuitry included in a conventional electron microscope when a noise canceling function is used.
Figure 16:
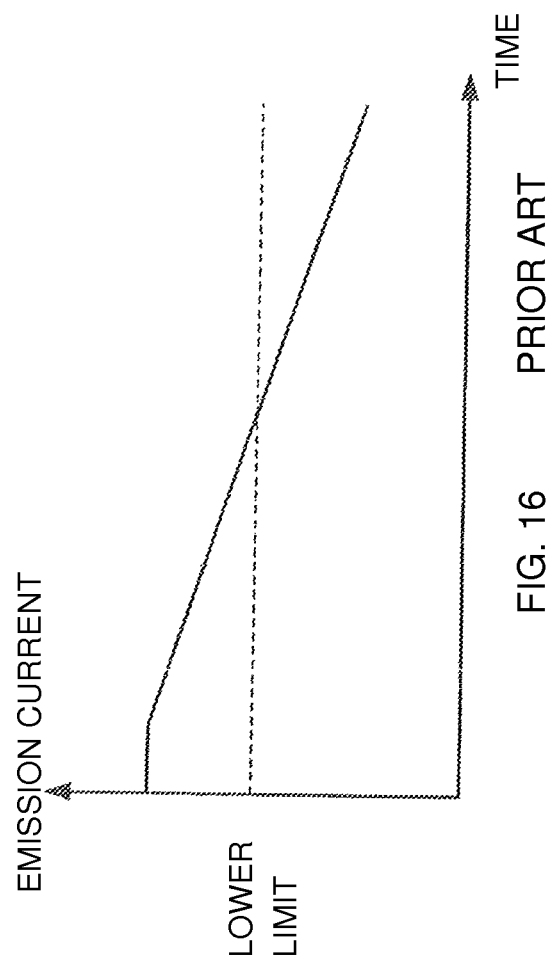
FIG. 16 is a graph showing one example of how emission current varies with time.

FIG. 11 is a diagram showing a specific example of configuration of signal processing circuitry according to the fourth embodiment. In both FIGS. 2 and 11, like constituent elements are indicated by like reference numerals and their description is omitted. FIGS. 12A-12I show examples of signal waveforms at various nodes of the circuitry of FIG. 11. As shown in FIG. 11, the configuration of the present embodiment is similar to the configuration of FIG. 2 except that the adder 22 of the preamplifier circuit 20 and the subtractor 52 of the noise canceling circuit 50 are omitted and that the adder 56 and the switch circuit 59 in the noise canceling circuit 50 are reversed in connection order.

In the present embodiment, an image signal S×I1 (see FIG. 12A) obtained from the detector 15 is amplified by a factor of Gp by the amplifier circuit 24 of the preamplifier circuit 20. Therefore, the output signal $V_1$ (see FIG. 12B) (output signal from the preamplifier circuit 20) from the amplifier 24 is given by $$V_1 = Gp \times S \times I1 \tag{12}$$

The output signal $V_1$ from the preamplifier circuit is amplified by a factor of Ga by the amplifier 32. Therefore, using Eq. (12), the output signal $V_2$ (see FIG. 12C) from the amplifier 32 (output signal from the amplifier circuit 30) is given by $$V_2 = Ga \times Gp \times S \times I1 \tag{13}$$

When the noise canceling function is inactive, the output signal $V_2$ from the amplifier circuit 30 is applied to the adder 56 via the switch circuit 59 and added to the output signal from the amplifier 57. The amplifier 57 gives a gain, Gp×Ga, equal to the product of the gain Gp of the amplifier 24 and the gain Ga of the amplifier 32 to the brightness B. Therefore, the output signal $V_7$ from the adder 56 is given by $$V_7 = Ga \times Gp \times (S \times I1 + B) \tag{14}$$

The analog output signal $V_7$ from the adder 56 is applied to the processing section 60 and converted into digital form by the A/D converter 62 and then averaged or otherwise arithmetically processed and sent to the PC 2 shown in FIG. 10.

On the other hand, where the noise canceling function is active, the output signal $V_2$ from the amplifier circuit 30 is noise-canceled and then applied to the adder 56 via the switch circuit 59.

In particular, the output signal $V_2$ from the amplifier circuit 30 is applied to the input (X) on the numerator side of the divider circuit 54. The output signal from the amplifier 42 contained in the noise detection circuit 40 is applied to the input (Y) of the denominator side of the divider circuit 54. As described already in connection with the first embodiment, the amplifier 42 converts the emission current I2 (see FIG. 12D) detected by the noise canceling aperture 12 into a voltage and amplifies it by a factor of Gn. Therefore, the output signal $V_4$ (see FIG. 12E) from the amplifier 42 is given by Eq. (4) above.

Accordingly, using Eqs. (13) and (4), the output signal $V_5$ (see FIG. 12F) from the divider circuit 54 is given by the following Eq. (15), which is the same as Eq. (5) above.

$$V_5 = \frac{X}{Y} = \frac{V_2}{V_4} = \frac{Ga \times Gp \times S \times I1}{Gn \times I2} \tag{15}$$

As already described with reference to the first embodiment, the multiplier circuit 58 performs multiplication of the output signal $V_5$ (see FIG. 12F) from the divider circuit 54 and the output signal $(Gn \times I2)_{RMS}$ (see FIG. 12G) from the effective value calculating circuit 44. Therefore, the output signal $V_6$ (see FIG. 12H) from the multiplier circuit 58 is represented by the above Eq. (6) and approximated by the above Eq. (10) as already described in relation to the first embodiment.

The output signal $V_6$ from the multiplier circuit 58 is applied to the adder 56 via the switch circuit 59 and added to the output signal (Gp×Ga×B) from the amplifier 57 by the adder 56. Therefore, the output signal $V_7$ (see FIG. 12I) from the adder 56 is approximated by the above Eq. (11).

The analog output signal $V_7$ from the adder 56 is applied to the processing section 60 and converted into digital form by the A/D converter 62, then averaged or otherwise arithmetically processed, and sent to the PC 2 shown in FIG. 10.

In the present embodiment, the electron beam source 11 corresponds to the "electron beam source" of the present invention. The noise canceling aperture 12 and the amplifier 42 together correspond to the "electron beam detecting portion" of the present invention. The effective value calculating circuit 44 corresponds to the "DC component extracting portion" of the present invention. The detector 15, the preamplifier circuit 20, and the amplifier circuit 30 together correspond to the "image detecting portion" of the present invention. The divider circuit 54 corresponds to the "division portion" of the present invention. The multiplier circuit 58 corresponds to the "multiplication portion" of the present invention.

According to the electron microscope of the fourth embodiment described so far, the same signal as in the first embodiment is applied to the processing section 60 whether the noise canceling function is inactive or active. Consequently, the electron microscope of the fourth embodiment yields the same advantageous effects as the first embodiment, although the configuration is simpler than the first embodiment.

The present invention is not restricted to the present embodiment. Rather, various changes and modifications are possible without departing from the gist and scope of the present invention.

It is to be understood that the above-described embodiments are merely exemplary and that the present invention are not restricted thereto. For example, the various modifications may be combined appropriately.

The present invention embraces configurations substantially identical (e.g., in function, method, and results or in purpose and advantageous effects) with the configurations described in the embodiments of the invention. Furthermore, the invention embraces configurations described in the embodiments and including portions which have non-essential portions replaced. In addition, the invention embraces configurations which produce the same advantageous effects as those produced by the configurations described in the embodiments or which can achieve the same objects as the configurations described in the embodiments. Further, the invention embraces configurations which are similar to the configurations described in the embodiments except that well-known techniques have been added.

Having thus described my invention with the detail and particularity required by the Patent Laws, what is desired protected by Letters Patent is set forth in the following claims.

The invention claimed is:

1. An electron microscope comprising:
   an electron beam source for producing an electron beam;
   an electron beam detecting portion for detecting a part of the electron beam;
   a DC component extracting portion for extracting DC components of an output signal from the electron beam detecting portion;
   an image detecting portion for detecting a signal obtained in response to impingement of the electron beam on a sample;
   a division portion for performing a division based on an output signal from the image detecting portion and on an output signal from the electron beam detecting portion; and a multiplication portion for performing a multiplication of a signal indicative of the result of the division performed by the division portion and a signal extracted by the DC component extracting portion.

2. The electron microscope as set forth in claim 1, wherein said DC component extracting portion calculates an effective value of the output signal from said electron beam detecting portion, taken over a given period of time.

3. The electron microscope as set forth in claim 2, wherein said given period of time is set to be long enough to obtain one frame of image containing an image of the sample based on the signal obtained in response to impingement of the electron beam on the sample.

4. The electron microscope as set forth in claim 1, wherein said DC component extracting portion integrates an output signal from said electron beam detecting portion, removes DC components of the integral output signal to thereby produce a second integral signal, produces a third integral signal opposite in polarity to the second integral signal, and sums up the second and third integral signals.

5. The electron microscope as set forth in claim 1, wherein processing performed by said DC component extracting portion, said division portion, and said multiplication portion is performed by digital computations.

6. The electron microscope as set forth in claim 2, wherein processing performed by said DC component extracting portion, said division portion, and said multiplication portion is performed by digital computations.

7. The electron microscope as set forth in claim 3, wherein processing performed by said DC component extracting portion, said division portion, and said multiplication portion is performed by digital computations.

8. The electron microscope as set forth in claim 4, wherein processing performed by said DC component extracting portion, said division portion, and said multiplication portion is performed by digital computations.

9. A method of operating an electron microscope, comprising the steps of:
    detecting a part of an electron beam generated by an electron beam source to thereby produce a first signal;
    extracting DC components of the first signal to produce a second signal;
    detecting a signal obtained by impingement of the electron beam on a sample to produce an image signal;
    performing a division based on the image signal and on the first signal;
    multiplying a signal indicative of the result of the division by the second signal; and
    displaying an electron microscope image based upon the product of the multiplication in the previous step.

* * * * *